US006177363B1

(12) United States Patent
Roy et al.

(10) Patent No.: US 6,177,363 B1
(45) Date of Patent: Jan. 23, 2001

(54) METHOD FOR FORMING A NITRIDE LAYER SUITABLE FOR USE IN ADVANCED GATE DIELECTRIC MATERIALS

(75) Inventors: Pradip K. Roy; Yi Ma; Michael A. Laughery, all of Orlando, FL (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/162,542

(22) Filed: Sep. 29, 1998

(51) Int. Cl.$^7$ .......................... H01L 21/336; H01L 21/31
(52) U.S. Cl. .......................... 438/791; 438/287; 438/769; 438/786; 438/787
(58) Field of Search .................................. 438/287, 763, 438/769, 770, 786, 787, 791

(56) References Cited

U.S. PATENT DOCUMENTS

| | | |
|---|---|---|
| 4,623,912 | 11/1986 | Chang et al. . |
| 4,814,291 | 3/1989 | Kim et al. . |
| 4,851,370 | * 7/1989 | Doklan et al. ........................ 437/225 |
| 5,132,244 | * 7/1992 | Roy ......................................... 437/13 |
| 5,153,701 | * 10/1992 | Roy ......................................... 357/54 |
| 5,536,667 | 7/1996 | Cho . |
| 5,940,736 | * 8/1999 | Brady et al. ........................... 438/787 |

OTHER PUBLICATIONS

P.K. Roy, D. Brady, S. Chetlur, Y. Ma & K. Morse, "Synthesis of Ultra–Thin Stacked Oxides Using Low Pressure Single Furnace Cluster Process", *Mat. Res. Socl Symp. Proc.*, 1977 Materials Research Society, pp. 89–94.

P.K. Roy and I.C. Kizily Alli, Stacked High–Dielectric Constant Gate Dielectric for Gigascale Integration of Metal–Oxide–Semiconductor Technologies:, *Applied Physics Letters*, Jun. 1, 1998, vol. 72, No. 22, pp. 2835–2837.

\* cited by examiner

*Primary Examiner*—John F. Niebling
*Assistant Examiner*—Alexander G. Ghyka

(57) ABSTRACT

A method for forming a gate dielectric for use in ultra-thin integrated circuit environments includes forming a nitride layer under conditions effective to introduce defects in the nitride layer. The nitride layer is formed so as to have a defect density which is sufficiently large to provide a low interfacial trap density, particularly after annealing, and thus eliminate the charge trap problems associated with traditional nitride layers. This nitride layer can be used in, for example, ON or ONO structures, which can themselves be employed as a gate dielectric. The ON and ONO structures are preferably formed under low temperature and low pressure conditions to more effectively control oxide and nitride formation. This allows for the formation of gate dielectrics that are less than 10 nm in thickness. Moreover, these ultra-thin dielectrics can be formed in a single furnace cluster.

41 Claims, 1 Drawing Sheet

METHOD FOR FORMING A NITRIDE LAYER SUITABLE FOR USE IN ADVANCED GATE DIELECTRIC MATERIALS

FIELD OF THE INVENTION

The invention relates to a method for fabricating integrated circuits and, in particular, a method that includes the introduction of a nitride layer in an ultra-thin gate dielectric for the integrated circuit. The invention also relates to an integrated circuit that includes the inventive nitride layer.

BACKGROUND OF THE INVENTION

Recent advances in the field of metal-oxide-semiconductor ("MOS") technology have included scaling down of gate dielectric thickness. As the thickness of these devices decreases, a number of problems have been encountered. For example, as the overall size becomes "ultra-thin", e.g., less than 75 Å, the quality of the $Si/SiO_2$ interface characteristics play dominate roles in determining the quality of gate oxide. In fact, film thicknesses below 25 Å suffer from excessive tunneling current ($>1A/cm^2$) problems as they approach the tunneling limit. On such thin gate dielectrics, suppression of boron diffusion from $p^+$ poly gate into channel regions is also a serious concern. These problems have severely hampered the ability to fabricate integrated circuit utilizing "ultra-thin" designs.

To address such problems, the art has sought to provide a reliable, high quality gate dielectric having the desired properties of low defect density, $D_o$, and high breakdown field strength, $F_{bd}$, that retains its quality during advanced processing. Although the art has been able to provide oxide/nitride (ON) and oxide/nitride/oxide (ONO) structures having excellent (lower $D_o$) behavior, such structures have suffered from serious charge trapping problems. That is, because the oxidizing species will not penetrate the nitride layer, the interface (nitride/oxide) traps cannot be annealed. Thus, nitride structures cannot be effectively employed on gate dielectrics.

Stacked oxides, however, have alleviated such problems, thereby achieving simultaneous solutions to low leakage (low $D_o$) and low trap densities ($D_{it}, Q_f$).

For example, U.S. Pat. No. 4,851,370 includes a composite stack synthesized by a three-step grow-deposit-grow technique where the growing steps are conducted at pressures equal to or greater than one atm to achieve ultra-low $D_o$, $D_{it}$ oxides with a planar and stress free $Si/SiO_2$. This patent is incorporated by reference in its entirety for all purposes.

Alternatively, a copending U.S. application of the same assignee, i.e., U.S. Application Serial No. (Brady Apr. 10, 1935) which is incorporated herein by reference, discloses certain low pressure techniques for providing a stacked oxide arrangement for thinner gate dielectrics, e.g., less than 65 Å. This method can also involve a sequence of grow-deposit-grow steps, however, in this case, the steps are performed in a zone of low pressure, e.g., a pressure that is preferably about 200 milliTorr to 950 milliTorr. The use of such low pressures can, e.g., retard the oxidation rate at which the first and second oxide layers are grown.

The resulting stack structure has superior electrical and substructural properties as compared to that provided by a conventional oxidation scheme. The method disclosed in this copending application also allows the ultra-thin oxide layers to be formed in a single furnace cluster step that can significantly decrease the cost of the process.

Despite the significant advantages that can be associated with these stacked oxide arrangements, they have not effectively resolved boron (B) diffusion issues.

Thus, the need still exists for a gate dielectric which is capable of providing both the advantages associated with the stacked oxides, e.g., a low interfacial trap, and which is also a suitable boron blocker.

SUMMARY OF THE INVENTION

The present invention is based at least in part on the surprising discovery that a controlled quantity of defects can be introduced into a nitride layer and that these defects are capable of significantly minimizing (or even eliminating) the charge trap problem that has prevented the use of nitride containing structures on gate dielectrics.

A first aspect of the invention relates to a method for forming a nitride layer in which defects are introduced into the nitride layer. In particular, the method provides a defect density for nitride layer that is sufficiently large for diffusional transport of one or more annealing species, e.g., $O_2,N_2,H_2,N_2O$, and the like, to reduce the interfacial trap density. To this end, the nitride layer is preferably introduced onto the oxide layer under conditions of both low temperature, e.g., less than 900 C and low pressure, e.g., of less than 1 Torr.

Another aspect of the invention relates to a method for forming an ON gate dielectric which can be employed in an ultra-thin integrated circuit environment. This method comprises the steps of providing an oxide layer either directly or indirectly on a semiconductor substrate and then depositing a nitride layer on the oxide layer under conditions effective to introduce defects into the nitride layer. Here, the nitride layer includes an amount of defects sufficiently large to be semi-transperent to oxygen diffusion so as to allow annealing out of the interfacial traps. This method can further include the additional introduction of the second oxide layer on the nitride layer to provide an ONO structure.

Yet another aspect of the invention involving the use of low pressure oxidation that allows for the controlled formation of the oxide as well as nitride layer and thus, provide an ultra-thin gate dielectric.

In another aspect of the invention, each of the oxide layers as well as the nitride layer is performed in a single furnace cluster.

Other aspects of the invention relate to the gate dielectric as well as an integrated circuit utilizing the gate dielectric. These and other aspects of the invention will become apparent from the description and claims that follow.

BRIEF DESCRIPTION OF THE DRAWING

The FIGURE is an example of a gate dielectric according to the present invention.

DETAILED DESCRIPTION OF THE PREFERRED EMBODIMENTS

Figure 1:
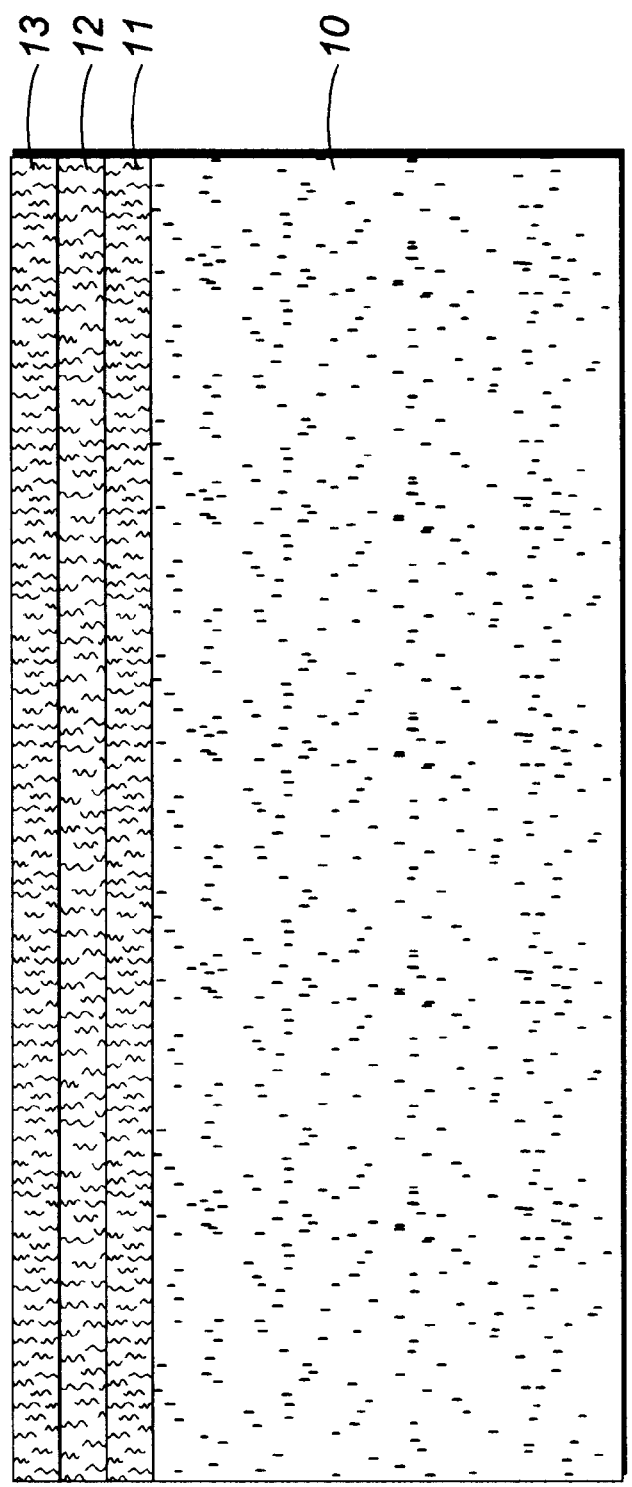

As discussed above, the present invention relates to a method for forming a nitride layer that provides for the controlled introduction of defects into the layer. This process can be used to provide a quantity of defects sufficient to provide diffusional transport of annealing species and, thus, a low interfacial trap density, particularly after annealing.

By "defects" it is meant those chemical or structural irregularities that impact upon the electrical characteristics of the nitride layer. The quantity of defects present in a layer can be characterized through its defect density.

Methods for determining defect density are well recognized in the art. For example, the defect density, $D_o$, can be estimated by measuring the gate oxide leakage of large area ($A=0.225$ cm$^2$) capacitors that are formed by a single polysilicon plate covering rectangular p-well gate oxide islands separated by strips of field oxide (FOX). Tests can be performed by applying a gate bias of 2 V and measuring the leakage current. To assure a high level of confidence a large number, typically 250, capacitors are tested. Results can be described as a probability distribution with the $D_o$ number being calculated from the yield (Y) data according to the equation $Y = e^{-AD_o}$.

A preferred defect density is typically greater 0.5/cm$^2$, more preferably greater than 1.0/cm$^2$. However, it should be kept in mind that the only requirement is that the defect density be sufficient to allow diffusion of annealing species, e.g., oxygen and the like during an anneal to migrate out through, e.g., a nitride/oxide interface.

By "low" interfacial trap density it is meant that the trap density is sufficiently low, e.g., particularly after annealing, to allow the use of the nitride layer in a gate dielectric structure.

Methods for determining trap density are recognized in the art. For example, C-V or non-contact Q-V technique and current ramp (J-ramp) measurements can be performed on small-area ($2.5 \times 10^{-4}$ cm$^2$) capacitors. High frequency (1 MHz) and quasi-static C-V and non-contact corona-oxide-semiconductor techniques can then be used to estimate the interface trap densities ($D_{it}$) over the Si bandgap. In the J-ramp technique, a large number, typically 200, sites were tested under substrate injection conditions. The capacitors can be subjected to a current ramp and the voltage that develops across the capacitors is measured as a function of time until the oxide fails. Failure occurs when the measured voltage $V_m$ across the capacitors drops to less than 85% of the previous value at time t. The area under the J-ramp curve (log I Vs T ) is the charge-to breakdown ($Q_{bd}$, coulombs/cm$^2$) or the total charge fluence characteristics of the thin oxide. The tunneling voltage, $V_{fn}$, is evaluated as the reciprocal of the slope of the Fowler-Nordheim (FN) tunneling curve when a tunneling current in the 1–10 nA range is forced through the gate oxide. The breakdown voltage $V_{bd}$ is estimated as the median of the voltage generated on all small area GOX capacitors by forcing a final current before destructive breakdown. Some of the electrical data ($D_{it}$, $V_{fn}$) can further be corroborated by the Keithley Quantox non-contact oxide measuring system. The technique is capable of generating Q-V and SPV-V curves that are analogous to traditional J-ramp and C-V curves.

In this invention, a suitable trap density is preferably less than $1 \times 10^{11}$ cm$^2$.eV, more preferably less than $5 \times 10^{10}$/cm$^2$.eV.

In one preferred embodiment of this invention, the nitride layer is introduced onto an oxide layer in an integrated circuit environment. Techniques, in general, for introducing a nitride layer onto an oxide layer are recognized in the art.

A specific example of a suitable technique involves the controlled introduction of $NH_3$ and $SiH_2Cl_2$ under temperatures, pressures and relative concentrations are suitable to produce the desired defects in the nitride layer. In general, this aspect of the invention can be provided by the appropriate choice of conditions, e.g., temperature, pressure as well as $NH_3$ to $SiH_2Cl_2$ ratio, sufficient to introduce the desired defects into the nitride layer.

A primary technique, chemical vapor deposition, is well recognized in the art. Although not limited thereto, the use of low pressure chemical-vapor-deposition (CVD) techniques is preferred for use in the invention. For example, a preferred temperature is in the range of 600–800° C. with 700–750° C. being more preferred. As to pressure, the use of a pressure less than 1 Torr is preferred, with a pressure of less than 900 milliTorr being more preferred and about 25 and 500 milliTorr being even more preferred.

Another condition can involve the ratio of reactants, e.g., $NH_3$ and $SiH_2Cl_2$, used in producing the nitride. While the preferred reactant of $NH_3$ and $SiH_2Cl_2$ are discussed in detail, other known reactants such as $NH_3$ and $SiH_4$ can be employed in the invention. To this end, where $NH_3$ and $SiH_2Cl_2$ are used, they are employed in amounts such that the ratio of $NH_3$ to $SiH_2Cl_2$ ranges from 1:1–10:1 with a more preferred ratio of about 1:1–2:1. Moreover, in terms of gas flow, $NH_3$ is preferably introduced at 150–300 sccm, more preferably 150–200 sccm, while preferably introduced at $SiH_2Cl_2$ is 30–200 sccm, more preferably 75–200 sccm.

The nitride layer is preferably employed, in combination with one or more oxide layers, as a gate dielectric in ultra-thin integrated circuit environments. The gate dielectric preferably comprises a ON or an ONO structure on a semiconductor substrate. The thickness of the gate dielectric is preferably less than 7.5 nm, more preferably less than 5.0 nm. In one specific embodiment the thickness of the gate dielectric is about 3.0 nm. To this end, the process of the present invention is capable of providing nitride layers which have a thickness less than 25 Å, in fact, the process is capable of providing thicknesses as low as 15 Å.

This aspect of the invention also involves a method for forming the desired ON or ONO structure. The first step involves forming an oxide layer on a substrate. In this aspect of the invention, the use of a silicon substrate is preferred, however, it should be understood that other semiconductor substrates, such as germanium silicon, can also be employed. Moreover, the oxide layer can be either formed directly or indirectly on the substrate. That is, the oxide layer can be introduced onto a layer which itself is on the substrate.

Techniques for introducing oxide layers, e.g., growing the oxide and deposition of an oxide are known in the field. As such they will not be discussed in detail here. However, for sake of completeness, applicant would note that growing the desired oxide, and in particular, growing an oxide under low pressure conditions such as those disclosed in copending U.S. Application (Brady Apr. 10, 1935) is the preferred technique for forming the initial oxide layer. Each of the techniques discussed in that copending application can be used in this invention.

One specific example of a suitable method includes thermally growing a silicon dioxide layer from silicon substrate to a thickness of about 1 nm to about 2.5 nm. In this example, the oxide layer is thermally grown under low pressure conditions which range from about 0.4 Torr to about 10 Torr and at a temperature ranging from about 600° C. to about 1000° C. A temperature range of about 650–750° C. is preferred. The preferred pressure range is from about 800–1000 milliTorr, more preferably about 900 milliTorr. In this embodiment, the oxygen flow is from about 0.5 standard liters per minute (slm) to about 25 slm. Preferably, the oxygen flow rate is about 1.9 slm.

As discussed in the copending stacked oxide application, the use of low pressures is a radical departure from conventional stacked oxide synthesis in which the oxide layer is grown at pressures of 1 atm or greater. It has been surprisingly found that the use of low pressures not only provides the ability to control the growth of the oxide layer and, thus, provide an ultra-thin layer, i.e., on the order of 1 nm to 2.5 nm, without adversely affecting the electrical physical properties of the semiconductor.

Subsequent to formation of this initial oxide layer, a silicon nitride layer having the controlled amount of defects is deposited thereon. In this embodiment, the nitride layer is preferably introduced under low pressure conditions, e.g., 25–500 milliTorr and low temperatures, e.g., 600–800° C. preferably 700–750° C. Moreover, the silicon nitride is preferably produced from the combination of $NH_3$ and $SiH_2Cl_2$ which are introduced at a ratio of about 2:1–15:1 preferably 3:1–12:1. As discussed above, the use of low pressures allows for the formation of ultra-thin layers.

This combination of steps provides for an improved oxide/nitride, or ON, structure that is suitable for use as a dielectric in integrated circuits. This structure is also illustrated in the drawing figure generally at 1. The substrate 10 has oxide layer 11 and nitride layer 12 located thereon.

Where an ONO structure is desired, a second silicon dioxide layer 13 can be introduced onto the nitride layer. Once again, techniques for introducing this second oxide layer, i.e., methods for depositing a silicon dioxide layer onto a nitride layer, are recognized in the art. Any of these known techniques can be employed in the invention. However, as will be seen, the low pressure deposition of silicon dioxide is preferred.

In this embodiment, a combination of either (i) $N_2O$ or possibly even $O_2$ (although $N_2O$ is preferred due to safety considerations) and (ii) $SiH_2Cl_2$ are introduced at a ratio of about 1:1–10:1, preferably 2:1–5:1. In particular, the components can be introduced in an amount of 150–300 sccm and 30–150 sccm, respectively. The deposition process is also preferably performed at low pressures, i.e., less than about 1000 milliTorr, preferably about 25–500 milliTorr, and low temperatures, preferably 600–900° C., more preferably 700–750° C.

Once again, the use of low temperatures and pressures allows for the controlled growth of oxides and, thus, the formation of ultra-thin layers of oxide. To this end, it is preferred that the oxide layer have a thickness less than 50 Å, preferably less than about 20 Å.

As was the case with the ON structure, this ONO structure can be effectively employed as a gate dielectric in ultra-thin integrated circuit environments. In fact, not only can the material be used as a dielectric, the invention is capable of providing an improved ON or ONO structure in integrated circuit design. To this end, the use of a nitride layer according to the present invention is capable of solving the undesirable charge trap associated with traditional nitride layers while at the same time providing for suitable boron blocking.

Finally, the fabrication process can further include other steps such as annealing of the nitride layer so as to effectively reduce or even remove any trap which is present at the interface, and improve $Si/SiO_2$ interfacial qualifies in terms of stress gradient. These techniques are recognized in the art, and, as such, need not be described in detail here.

As can be seen, those skilled in the art would be capable, upon proper selection of temperature, pressure and reactant ratio to provide any desired quantity of defects in the nitride layer. This "goal" is in direct contrast to the "goal" recognized in the past, i.e., to provide a nitride layer that was, in essence, defect free.

Another significant advantage is the ability of the inventive process to provide an ON or ONO structure in a single low pressure furnace cluster. Since only a single furnace cluster is required, the inventive method can provide significant cost saving over traditional ON and ONO synthesis techniques that require the use of two or even three separate furnaces.

While the present invention has been discussed in terms of certain preferred embodiments thereof, it will be appreciated that various substitutions, modifications, omissions, and other changes may be made without departing from the spirit thereof. Thus, the scope of the present invention should be limited solely by the scope of the following claims including equivalents thereof.

What is claimed is:

1. A method of forming a gate dielectric on a semiconductor substrate comprises:

(a) providing an oxide layer directly or indirectly on a semiconductor substrate; and (b) depositing a nitride layer on said oxide layer under conditions effective to introduce defects in the nitride layer such that the defect density of the nitride layer is sufficiently large to allow diffusional transport of one or more annealing species, said nitride layer having a defect density greater than about $0.5/cm^2$, and said nitride layer deposited on said oxide layer under a pressure of less than about 1 Torr and a temperature of less than about 900° C.

2. The method according to claim 1, wherein said method provides a gate dielectric having a thickness not greater than 10 nm.

3. The method according to claim 2 wherein the thickness of the gate dielectric is not greater than 5 nm.

4. The method according to claim 1 wherein the annealing species is selected from among $O_2,N_2,H_2$, and/or $N_2O$ and the method further comprises (c) annealing of the dielectric.

5. The method according to claim 1 wherein the interfacial trap density of the nitride layer, subsequent to annealing, is not greater than $1\times10^{11}/cm^2.eV$.

6. The method according to claim 5 wherein the interfacial trap density of the nitride layer is not greater than $5\times10^{10}/cm^2.eV$.

7. The method according to claim 1 wherein the oxide layer is grown on said substrate.

8. The method according to claim 7 wherein the oxide layer is grown under low pressure conditions.

9. The method according to claim 1 wherein the oxide layer is deposited on said substrate.

10. The method according to claim 9 wherein the oxide layer is deposited under low pressure conditions.

11. The method according to claim 1 wherein steps (a) and (b) are performed in a low pressure zone.

12. The method according to claim 11 wherein pressure is less than 1 Torr.

13. The method according to claim 1 wherein steps (a) and (b) are performed in a single vapor deposition device.

14. The method according to claim 1 further comprising:

(c) providing a second oxide layer on said nitride layer.

15. The method according to claim 14 wherein said second oxide layer is deposited on said nitride layer.

16. The method according to claim 15 wherein said second oxide layer is deposited on said nitride layer under low pressure conditions.

17. The method according to claim 14 wherein steps (a)–(c) are each performed at a pressure of less than 1 Torr.

18. The method according to claim 17 wherein the pressure is from about 200 to about 950 milliTorr.

19. The method according to claim 14 wherein steps (a)–(c) are performed in a single vapor deposition device.

20. The method according to claim 14 wherein step (c) is performed at a pressure of 25–500 milliTorr.

21. The method according to claim 20 wherein step (c) is performed at a temperature of 700–750° C. and in the presence of (i) $N_2O$ or $O_2$ and (ii) $SiH_2Cl_2$ where the ratio of (i) to (ii) is 1:1 to 10:1.

22. The method according to claim 21 wherein the flow rate of $NH_3$ at 150–300 sccm and the flow rate of $SiH_2Cl_2$ is 30–15 sccm.

23. The method according to claim 1 wherein step (a) is performed at a temperature of about 650–750° C.

24. The method according to claim 23 wherein step (a) is performed at a pressure of 850–950 milliTorr and in the presence of oxygen having a flow rate of 1.5–2.0 Slm.

25. The method according to claim 1 wherein step (b) is performed at a temperature of 700–750° C.

26. The method according to claim 25 wherein step (b) is performed at a pressure of 25–500 milliTorr and in the presence of $NH_3$ and $SiH_2Cl_2$ at a ratio of 1:1 to 10:1.

27. The method according to claim 26 wherein the flow rate of (i) is 150–300 sccm and the flow rate of (ii) is 30–150 sccm.

28. A method for forming a nitride layer during fabrication of an integrated circuit comprises depositing a nitride layer onto an oxide layer under conditions effective to introduce defects into the nitride such that the defect density of the nitride layer that is greater than about $0.5/cm^2$ to allow for diffusional transport of annealing species.

29. The method according to claim 28 further comprises annealing of the nitride layer.

30. The method according to claim 29 wherein the interfacial trap density is less than $1\times10^{11}/cm^2 \cdot eV$ after annealing.

31. The method according to claim 29 wherein the interfacial trap density is less than $5\times10^{10}/cm^2 \cdot eV$ after annealing.

32. The method according to claim 28 wherein the nitride layer is part of an ultra-thin gate dielectric.

33. The method according to claim 32 wherein the thickness of the gate dielectric is not greater than 10 nm.

34. The method according to claim 28 wherein the nitride layer is deposited in a low temperature environment.

35. The method according to claim 34 wherein the temperature is 700–750° C.

36. The method according to claim 35 wherein nitride layer is deposited at a pressure is less than 1 Torr.

37. The method according to claim 36 wherein the pressure is 25–500 milliTorr.

38. A method for fabricating an integrated circuit including a gate dielectric wherein the improvement comprises including a nitride layer in the gate dielectric is produced according to claim 1.

39. A method for fabricating an integrated circuit including a gate dielectric wherein the improvement comprises including a nitride layer in the gate dielectric is produced according to claim 14.

40. The method according to claim 1 wherein step (b) is performed at a temperature of less than 900° C.

41. The method according to claim 28 wherein the temperature is less than 900° C.

* * * * *